US009269412B2

(12) United States Patent
Shim et al.

(10) Patent No.: US 9,269,412 B2
(45) Date of Patent: Feb. 23, 2016

(54) MEMORY DEVICE AND METHOD FOR DRIVING THE SAME

(71) Applicant: SAMSUNG ELECTRONICS CO., LTD., Suwon-si (KR)

(72) Inventors: Yong Shim, Suwon-si (KR); In-Dal Song, Seoul (KR); Young Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 14/198,028

(22) Filed: Mar. 5, 2014

(65) Prior Publication Data

US 2014/0254295 A1 Sep. 11, 2014

Related U.S. Application Data

(60) Provisional application No. 61/772,641, filed on Mar. 5, 2013.

(30) Foreign Application Priority Data

Apr. 29, 2013 (KR) ........................ 10-2013-0047548

(51) Int. Cl.

| | |
|---|---|
| ***G11C 7/10*** | (2006.01) |
| ***G11C 7/22*** | (2006.01) |
| ***G11C 11/4076*** | (2006.01) |
| ***G11C 11/4093*** | (2006.01) |

(52) U.S. Cl.

CPC .............. *G11C 7/1072* (2013.01); *G11C 7/109* (2013.01); *G11C 7/1093* (2013.01); *G11C 7/222* (2013.01); *G11C 11/4076* (2013.01); *G11C 11/4093* (2013.01); *G11C 7/1006* (2013.01); *G11C 7/1051* (2013.01); *G11C 7/1078* (2013.01)

(58) Field of Classification Search

CPC ... G11C 7/1006; G11C 7/1051; G11C 7/1078
USPC ............... 365/189.02, 230.02, 200, 154, 205, 365/230.06

See application file for complete search history.

(56) References Cited

U.S. PATENT DOCUMENTS

| | | | |
|---|---|---|---|
| 5,923,193 A | 7/1999 | Bloch et al. | |
| 6,621,302 B2 | 9/2003 | Lowy et al. | |
| 7,471,131 B2 | 12/2008 | Liu et al. | |
| 7,649,910 B1 | 1/2010 | Wechsler et al. | |
| 2008/0052552 A1 | 2/2008 | Christensen et al. | |
| 2012/0099389 A1* | 4/2012 | Park ................. | G11C 11/40618 365/200 |

FOREIGN PATENT DOCUMENTS

| | | |
|---|---|---|
| JP | 10-336164 A | 12/1998 |
| KR | 10-0261901 B1 | 7/2000 |
| KR | 10-0328757 B1 | 3/2002 |

* cited by examiner

*Primary Examiner* — Jason Lappas

(74) *Attorney, Agent, or Firm* — Sughrue Mion, PLLC

(57) ABSTRACT

A memory device is provided. The memory device includes programming first bit data into a plurality of memory cells; identifying target memory cells which are in a first state and whose threshold voltages are equal to or greater than a first voltage from the memory cells programmed with the first bit data; receiving second bit data which is to be programmed into the memory cells; calculating a plurality of third bit data by performing a first process on the second bit data; selecting third bit data which changes a largest number of target memory cells from the first state to a second state in response to the memory cells being programmed with each of the plurality of third bit data from the plurality of third bit data; and programming the selected third bit data into the memory cells.

20 Claims, 9 Drawing Sheets

MEMORY DEVICE AND METHOD FOR DRIVING THE SAME

CROSS-REFERENCE TO RELATED APPLICATIONS

This application is based on and claims priority from U.S. Patent Application No. 61/772,641, filed on Mar. 5, 2013 in the U.S. Patent and Trademark Office, and Korean Patent Application No. 10-2013-0047548, filed on Apr. 29, 2013 in the Korean Intellectual Property Office, the disclosure of which is incorporated herein by reference, in its entirety.

BACKGROUND

1. Field

The exemplary embodiments relate to a memory device and a method for driving the same.

2. Description of the Prior Art

A semiconductor memory device, such as a DRAM (Dynamic Random Access Memory), has been continuously developed in order to increase the integrity thereof and to improve the operating speed thereof. In order to improve the operating speed of the DRAM, an SDRAM (Synchronous Dynamic Random Access Memory), which can operate in synchronization with an external clock signal that is input from an outside, has developed.

However, the SDRAM is insufficient to meet the speed of a system that requires high-speed operation. Accordingly, a DDR (Double Data Rate) RAM, which corresponds to a method of processing two sets of data in one clock cycle, has been proposed. The DDR RAM can successively input and output two sets of data in synchronization with a rising edge and a falling edge of an external clock signal that is input from the outside, and thus can perform high-speed operation.

On the other hand, the DDR RAM has been developed to "DDR2 SDRAM," "DDR3 SDRAM," and "DDR4 SDRAM" through generational changes. DDR2 SDRAM allows higher bus speed and requires lower power by running the internal clock at half the speed of the data bus. DDR3 SDRAM has twice the data rate of DDR2 SDRAM. DDR4 SDRAM has a high bandwidth interface. DDR4 SDRAM has faster clock frequencies and data transfer rates than DDR3 SDRAM, while the current remains the same.

SUMMARY

As memory devices gradually perform high-speed operations, it is not easy to secure a timing margin in the memory device. In order to solve this, a geardown mode for lowering the frequency of a clock has been used.

One subject to be solved by the exemplary embodiments is to provide a memory device, which can minimize the number of circuits being used without causing a timing skew to occur even when the geardown mode is used.

Another subject to be solved by the exemplary embodiments is to provide a method of driving a memory device, which can minimize the number of circuits being used without causing timing skew to occur even when the geardown mode is used.

Additional advantages, subjects, and features of the inventive concept will be set forth in part in the description which follows and in part will become apparent to those having ordinary skill in the art, upon examination of the following or may be learned from practice of the exemplary embodiments.

According to an aspect of the exemplary embodiments, a memory device is provided, the memory device including: (n−1) numbered dividers dividing a first clock and generating second to n-th divided clocks where, n is a positive integer that is equal to or larger than 2 ($n \geq 2$); a first delay configured to generate a first divided clock that is obtained by delaying the first clock for the same time as the second to n-th divided clocks; a mux configured to receive the first to n-th divided clocks and selecting one of the first to n-th divided clocks; a flip-flop connected to the mux to receive and synchronize the selected divided clock and a first signal with each other; and a command decoder configured to decode the synchronized signal provided from the flip-flop and generate an internal command signal.

According to an aspect of the exemplary embodiments, there is provided a memory device, the memory device including: a command control logic configured to generate an internal command signal; a memory cell array including a plurality of memory cells; and a sense amplifier/write driver configured to receive the internal command signal and operating the memory cell array, wherein the command control logic includes: (n−1) numbered dividers configured to divide a first clock and configured to generate second to n-th divided clocks where, n is a positive integer that is equal to or larger than 2 ($n \geq 2$); a first delay configured to generate a first divided clock that is obtained by delaying the first clock for the same time as the second to n-th divided clocks; a mux configured to receive the first to n-th divided clocks and selecting one of the first to n-th divided clocks; a flip-flop connected to the mux to receive and synchronize the selected divided clock and a first signal with each other; and a command decoder configured to decode the synchronized signal provided from the flip-flop and generate an internal command signal.

An aspect of an exemplary embodiment may provide a memory device including: a first delay configured to generate a first divided clock; (n−1) numbered dividers configured to generate second to n-th divided clocks; a mux configured to receive the first to n-th divided clocks and select one of the first to n-th divided clocks; a flip-flop connected to the mux and configured to receive and synchronize with each other a first signal and the selected first to n-th divided clock; and a command decoder configured to decode the received and synchronized signal provided from the flip-flop and generate an internal command signal.

The (n−1) numbered dividers divide the first clock prior to the first divided clock being generated by the first delay. The n of the n−1 numbered dividers is a positive integer that is equal to or larger than 2 ($n \geq 2$).

The generated first divided clock is obtained by delaying the first clock for the same period of time as the second to n-th divided clocks are delayed and the mux may be configured to receive a Mode Register Set signal.

The mux of the memory device may include n-numbered muxes which are connected to the first delay and the (n−1) numbered dividers in a one-to-one manner. In addition, the duty of the second to n-th divided clocks are smaller than ½. The duty of the first to n-th divided clocks is successively decreased.

BRIEF DESCRIPTION OF THE DRAWINGS

The above and other objects, features and advantages of the exemplary embodiments will be more apparent from the following detailed description taken in conjunction with the accompanying drawings, in which.

DETAILED DESCRIPTION OF THE EXEMPLARY EMBODIMENTS

Figure 1:
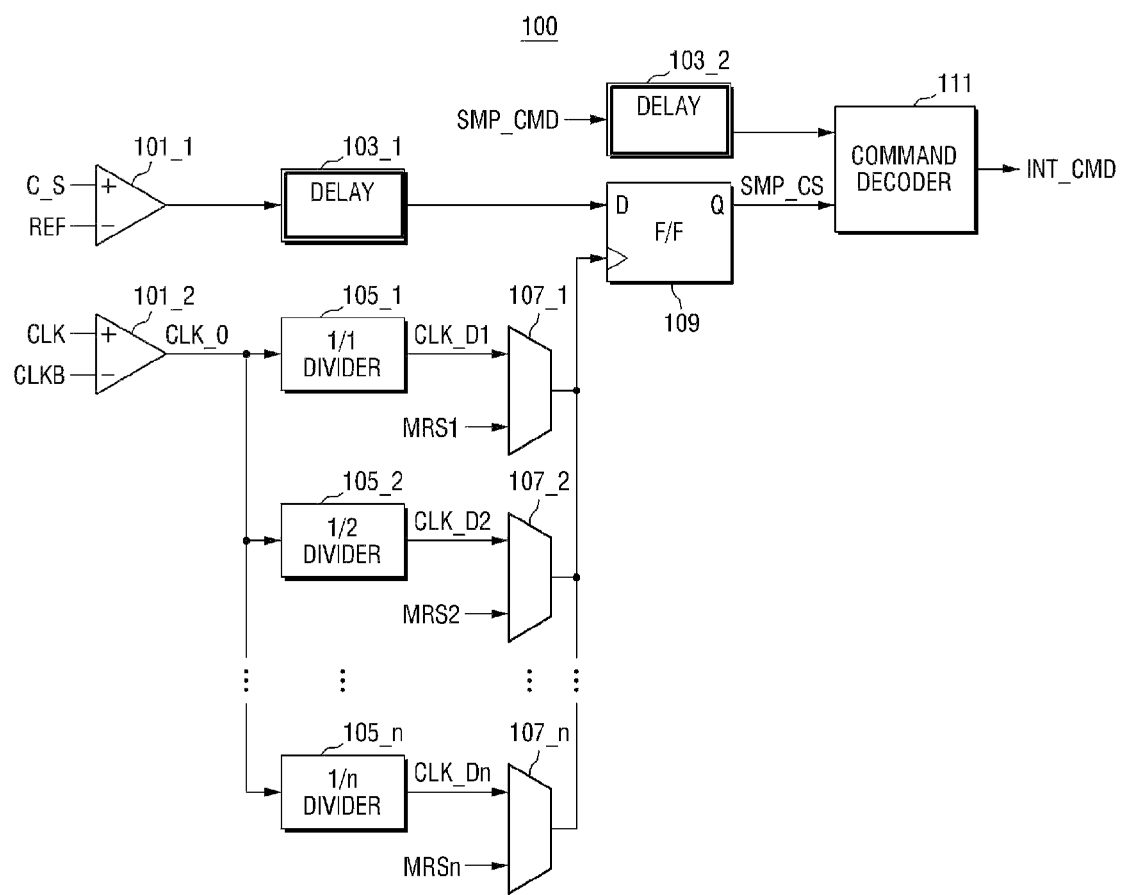
FIG. 1 is a block diagram of a memory device according to an exemplary embodiment.

The exemplary embodiments will now be described more fully hereinafter with reference to the accompanying drawings, in which preferred exemplary embodiments are shown. The exemplary embodiments may, however, be embodied in different forms and should not be construed as limited to the exemplary embodiments set forth herein. Rather, these exemplary embodiments are provided so that this disclosure will be thorough and complete, and will fully convey the scope to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, no intervening elements are present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The term "module," as used herein, means, but is not limited to, a software or hardware component, such as a field programmable gate array (FPGA) or an application specific integrated circuit (ASIC), which performs certain tasks. A module may advantageously be configured to reside in the addressable storage medium and configured to execute on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules.

The use of the terms "a" and "an" and "the" and similar referents in the context of describing the exemplary embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the exemplary embodiments.

Unless defined otherwise, all technical and scientific terms used herein have the same meaning as commonly understood by one of ordinary skill in the art to which the exemplary embodiments belong. It is noted that the use of any and all examples, or exemplary terms provided herein is intended merely to better illuminate the exemplary embodiments and is not a limitation on the scope of the inventive concept, unless otherwise specified. Further, unless defined otherwise, all terms defined in generally used dictionaries may not be overly interpreted.

Figure 2:
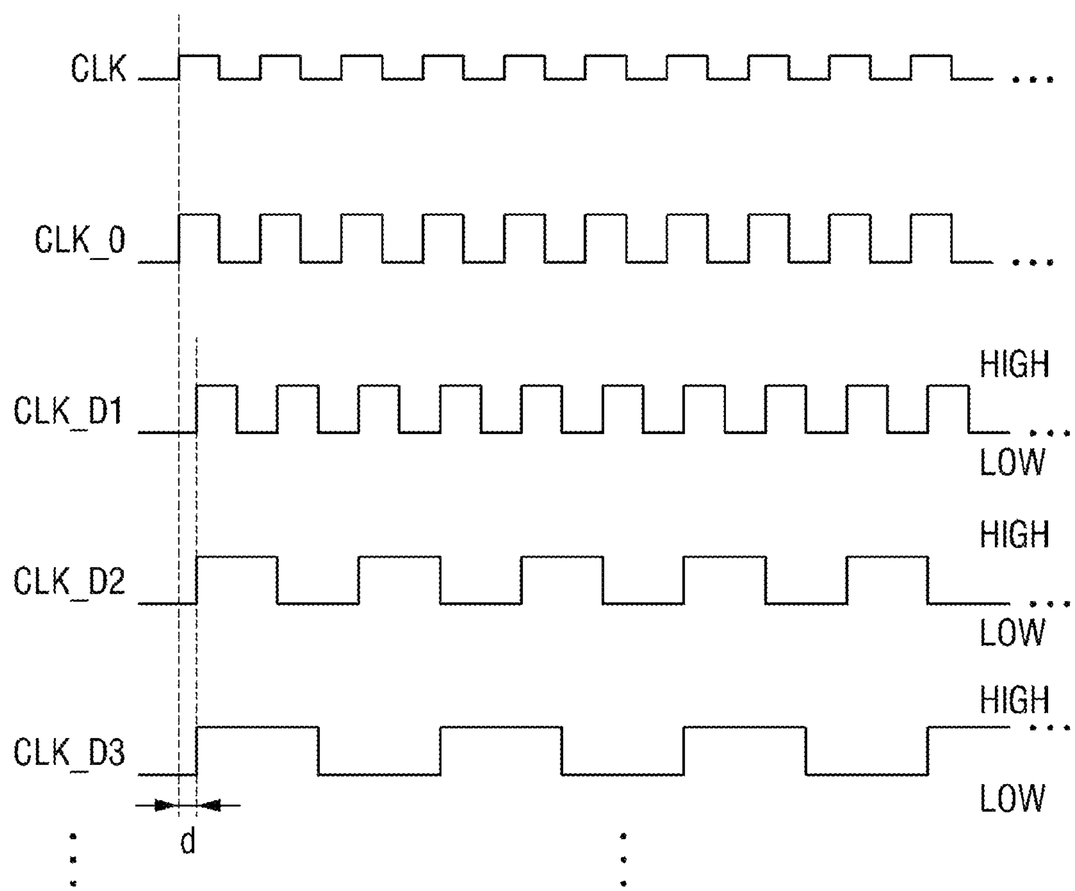
FIGS. 2 and 3 are timing diagrams which illustrate divided clocks output from a divider.
Figure 3:
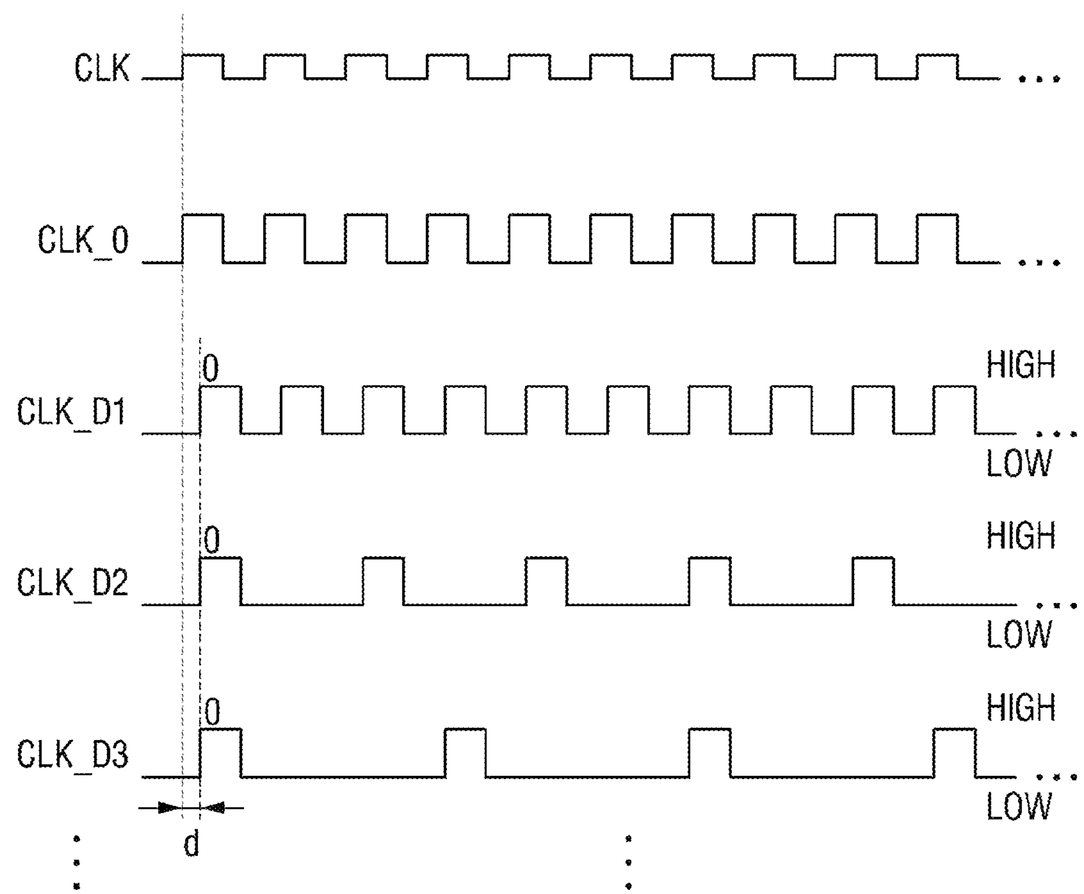

Hereinafter, a memory device according to an exemplary embodiment will be described with reference to FIGS. 1 to 3. FIG. 1 is a block diagram of a memory device according to an exemplary embodiment, and FIGS. 2 and 3 are timing diagrams which illustrate divided clocks output from a divider.

Hereinafter, for convenience in explanation, it is assumed that a memory device according to the exemplary embodiments is a DDR4 SDRAM that performs high-speed operation. However, the exemplary embodiments are not limited thereto.

Referring to FIG. 1, a memory device 100 according to an exemplary embodiment may include a signal buffer 101_1, a clock buffer 101_2, (n−1) numbered dividers 105_2 to **105_*n*, first and second delays 103_1 and 103_2, n-numbered muxes 107_1 . . . 107_*n*, a flip-flop 109, and a command decoder 111**. Here, n is a positive integer that is equal to or larger than 2, i.e., (n≥2).

A first clock CLK is provided to the first delay 105_1 and the (n−1) numbered dividers 105_2 to **105_*n* through the clock buffer 101_2. The clock buffer 101_2 serves to amplify the first clock CLK. In order to amplify the first clock CLK, a first clock bar CLKB may be provided to the clock buffer 101_2. The first clock bar LCKB is a clock which has the same size as the first clock, but has a 180-degree phase shift from the first clock. The clock buffer 101_2 amplifies the size of the first clock CLK, but does not change the cycle of the first clock CLK. Referring to FIG. 2, the clock buffer 101_2** amplifies the first clock LCK, and generates a first amplified clock CLK_O that has larger amplitude than the first clock CLK.

The first clock CLK_O that is amplified by the clock buffer 101_2 is provided to the first delay 105_1 and the (n−1) numbered dividers 105_2 to **105_*n***.

The (n−1)-numbered dividers 105_2 to **105_*n* are connected in parallel to the clock buffer 101_2, and may divide the first amplified clock LCK_O. Specifically, referring to FIGS. 1 and 2, the ½ divider 105_2 may generate a second divided clock CLK_D2, which has ½ of the frequency of the first amplified clock CLK_O. That is, the second divided clock CLK_D2 may have twice the cycle of the first amplified clock CLK_O. In the same manner, the ⅓ divider 105_3 may generate a third divided clock CLK_D3, which has ⅓ of the frequency of the first amplified clock CLK_O. That is, the respective (n−1) numbered dividers 105_2, 105_3, . . . , and 105**_*n* generate second to n-th divided clocks CLK_D2, CLK_D3, . . . , and CLK_Dn, respectively, which have ½, ⅓, . . . , and 1/n of the frequency of the first amplified clock CLK_O that is amplified by the respective dividers.

The first delay 105_1 outputs the first amplified clock CLK_O as it is, without changing the frequency of the first amplified clock CLK_O. Since the first delay 105_1 outputs the first amplified clock CLK_O without changing the frequency thereof, it may be considered as a 1/1 divider. However, the first delay unit 105_1 generates a first divided clock CLK_D1 that is obtained by delaying the first amplified clock CLK_O for a predetermined period of time.

The first delay 105_1 is necessary to match timing skew with the ½ to 1/n dividers 105_2, 105_3, . . . , 105_*n*. Specifically, referring to FIG. 2, the (n−1) numbered dividers 105_2 to 105_*n* generate the second to n-th divided clocks CLK_D2 to CLK_Dn. In this case, as the first amplified clock CLK_O is divided into the second to n-th divided clocks CLK_D2 to CLK_Dn, a delay for a predetermined period of time, that is, as long as d, may occur. Accordingly, it is necessary to delay the first divided clock CLK_D1 as long as d in the same manner as the second to n-th divided clocks CLK_D2 to CLK_Dn in order to prevent the occurrence of the skew. For this, the first delay 105_1 receives the first amplified clock CLK_O, and generates the first divided clock CLK_D1 through delaying of the first amplified clock CLK_O by a period as long as d.

On the other hand, the ½ to 1/n dividers 105_2 to 105_*n* may divide the first amplified clock CLK_O in a different form. Referring to FIG. 3, the ½ to 1/n dividers 105_2 to 105_*n* generate second to n-th divided clocks CLK_D2 to CLK_Dn, and the first delay 105_1 generates a first clock through delaying the first amplified clock CLK_O for a period as long as d. However, whereas the first to n-th divided clocks CLK_D1 to CLK_Dn in FIG. 2 have a ½ duty, the first to n-th divided clocks CLK_D1 to CLK_Dn in FIG. 3 may have a duty below ½. The duty may be presented as a ratio of time when the clock operates to be ON with respect to one period of the clock.

The clock may have two clock levels, that is, a first level and a second level. The first level means a clock level at which the clock operates to be ON, and the second level means a clock level at which the clock operates to be OFF. Accordingly, the duty refers to the ratio of high level time with respect to one period of the clock in the case where the clock operates to be ON at high level, and the duty refers to the ratio of low level time with respect to one period in the case where the clock operates to be ON at a low level.

Although FIGS. 2 and 3 illustrate that the clock operates to be ON at high level, it will be fully analogized by those skilled in the art that the clock operates to be ON at a low level through FIGS. 2 and 3.

Referring to FIG. 3, the duty of the first divided clock CLK_D1 is ½. However, the duty of the second divided clock CLK_D2 is not ½, but is ¼. Further, the duty of the third divided clock CLK_D3 is ⅙. Accordingly, the duty of the n-th divided clock CLK_Dn is 1/(2n). That is, in FIG. 3, the duties of the first to n-th divided clocks CLK_D1 to CLK_Dn may be successively decreased, and the second to n-th divided clocks CLK_D2 to CLK_Dn are smaller than ½.

The reason why the duties of the first to n-th divided clocks CLK_D1 to CLK_Dn are successively decreased is that there is a difference between the generation methods of the divided clock. In FIG. 3, in order to generate the first to n-th divided clocks CLK_D1 to CLK_Dn, unnecessary pulse signals are removed from the first amplified clock CLK_O. Specifically, the second divided clock CLK_D2 has a period that corresponds to two periods of the first amplified clock CLK_O, and in one period, only the first pulse, that is, the 0-th pulse, remains, but other pulses are all removed. In the same manner, the n-th divided clock CLK_Dn has a period that corresponds to n-numbered periods of the first amplified clock CLK_O, and in one period, only the first pulse, that is, the 0-th pulse, remains, but other pulses are all removed. The first divided clock CLK_D1 has a time delay as long as d in comparison to the first amplified clock CLK_O, and has the same period as the first amplified clock CLK_O.

Since the first pulse of the first amplified clock CLK_O remains as it is, the times when the clock is at high level, that is, at first level, for one period of the first to n-th divided clocks CLK_D1 to CLK_Dn may be equal to each other. Further, the times when the clock is at low level, that is, at second level, for one period of the first to n-th divided clocks CLK_D1 to CLCK_Dn may be different from each other.

It is generally understood that a signal applied to a memory device is synchronized with a rising edge of a clock. Accordingly, only the first pulse, that is, the 0-th pulse, is necessary for synchronization with the signal applied to the memory device, and other pulses in one period are not necessary. Accordingly, even if the first amplified clock CLK_O is divided as shown in FIG. 3, the memory device can normally operate. Further, if the first amplified clock CLK_O is divided as shown in FIG. 3, divided clocks can be formed through removal of only some pulses of the first clock CLK_O, and thus the dividers 105_2 to 105_*n* can be simply constructed.

On the other hand, although not illustrated in FIGS. 2 and 3, the first delay 105_1 and the ½ to 1/n dividers 105_2 to 105_*n* may additionally amplify the first amplified clock CLK_O as needed. Accordingly, the amplitude of the first to n-th divided clocks may be larger than that of the first amplified clock CLK_O.

Referring again to FIG. 1, the n-numbered divided clocks CLK_D1 to CLK_Dn, which are generated through the first delay 105_1 and the (n−1)-numbered dividers 105_2 to 105_*n*, are provided to n-numbered muxes 107_1 to 107_*n*. That is, the n-numbered muxes 107_1 to 107_*n* are connected to the first delay 105_1 and the (n−1)-numbered dividers 105_2 to 105_*n* in a one-to-one manner to receive the first to n-th divided clocks CLK_D1 to CLK_Dn.

The n-numbered muxes 107_1 to 107_*n* select one of the n-numbered divided clocks CLK_D1 to CLK_Dn. The selected divided clock S_CLKD is synchronized with the first signal C_S, and is used to generate an internal command signal Internal_command.

The n-numbered muxes 107_1 to 107_*n* receive n-numbered MRS (Mode Register Set) signals in order to select one divided clock. The first MRS signal MRS1 is input to the first delay unit 105_1, and the second to n-th MRS signals MRS2 to MRSn are input to the ½ to 1/n dividers 105_2 to 105_*n*, respectively. In accordance with the first to n-th MRS signals MRS1 to MRSn, only one mux 107 is enabled to output the selected divided clock S_CLKD. That is, one of the n-numbered muxes 107_1 to 107_*n* is selected to select one of the first to n-th divided clocks CLK_D1 to CLK_Dn.

The n-numbered muxes 107_1 to 107_*n* are connected to one flip-flop 109. The selected divided clock S_CLKD is provided to the flip-flop 109. The flip-flop 109 may receive and synchronize the selected divided clock S_CLKD and the first signal C_S, and generate a synchronized signal SMP_CS.

The first signal C_S is necessary to generate an internal command signal INT_CMD which instructs internal operation of the memory device 100. Accordingly, the first signal C_S may include, for example, at least one of a CS (Chip Select) signal, a CE (Chip Enable) signal, a CKE (Clock Enable) signal, and an ODT (On-Die Termination) signal. However, the exemplary embodiments are not limited thereto. For example, the first signal C_S may be an address signal ADDR or an external command signal CMD. That is, the signal that is related to the operation of the memory device 100 may be the first signal C_S.

The first signal C_S that is input to the memory device 100 may be provided to the flip-flop 109 through the signal buffer 101_1. The signal buffer 101_1 may serve to amplify the first signal C_S in the same manner as the clock buffer 101_2.

On the other hand, the first signal C_S may be first provided to the second delay 103_1 before being provided to the flip-flop 109. The second delay 103_1 serves to delay the first signal C_S for a predetermined time. The first clock CLK, which is applied to the memory device 100, may be delayed as it passes through the first delay 105_1 and the (n−1)-numbered dividers 105_2 to 105_*n*. Referring to FIGS. 2 and 3, the first clock CLK may be delayed as long as d as it passes through the first delay 105_1 and the (n−1) numbered dividers 105_2 to 105_*n*. Accordingly, the selected divided clock S_CLKD that is provided to the flip-flop 109 may also be a clock that is delayed for a predetermined period of time in comparison to the first clock CLK. The second delay 103_1 may delay the first signal C_S for the predetermined period of time in order to match the skew between the first signal C_S and the selected divided clock S_CLKD. Accordingly, the second delay 103_1 can prevent an error of the flip-flop 109 from occurring due to the timing skew between the first signal C_S and the selected divided clock S_CLKD.

The signal SMP_CS that is synchronized in the flip-flop 109 may be provided to the command decoder 111. The command decoder 111 may additionally receive the synchronized command SMP_CMD in addition to the provided synchronized signal SMP_CS, and may generate the internal command signal INT_COM. The synchronized command SMP_CMD may be a command CMD which is synchronized with the divided clock S_CLKD that is provided to the memory device. The command decoder 111 may generate the internal command signal INT_CMD by decoding the synchronized signal SMP_CS using the provided synchronized command SMP_CMD. Since the synchronized signal SMP_CS is provided to the command decoder 111 through several muxes, it may be delayed for a predetermined period of time, and thus the third delay 103_2 may delay the synchronized command SMP_SMD for the predetermined period of time in order to reduce the timing skew.

Several devices in the memory device 100 can operate by the internal command signal INT_CMD that is generated by the command decoder 111.

Figure 4:
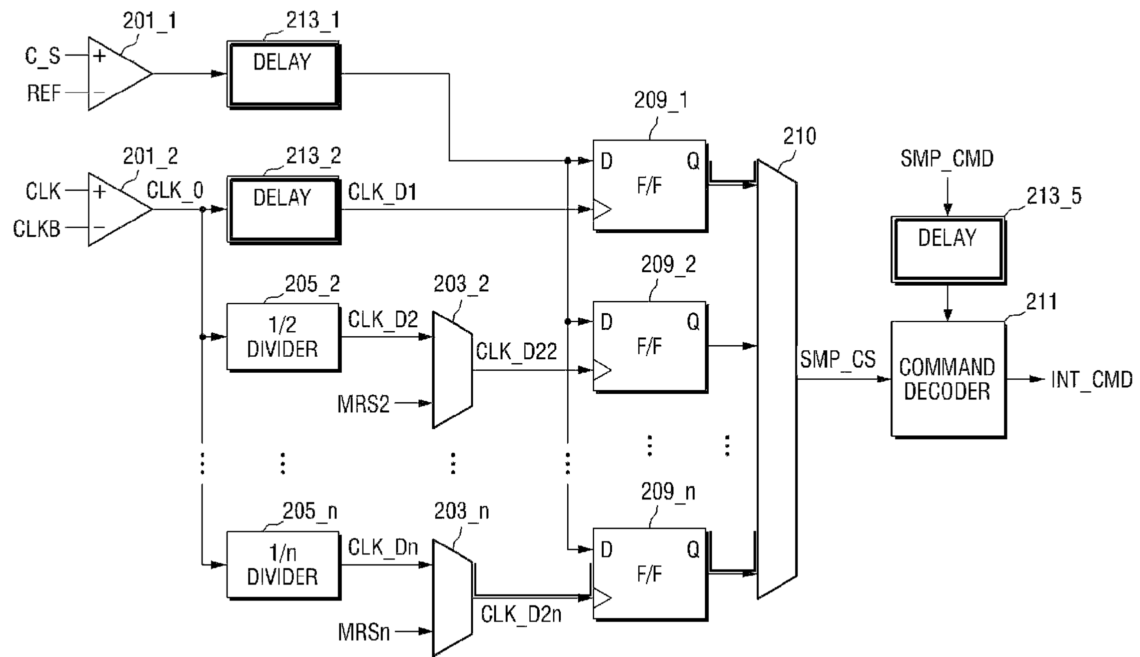
FIG. 4 is a block diagram of a memory device to explain the effects of the exemplary embodiments.

Referring to FIGS. 1 to 4, the effects of the exemplary embodiments will be described. FIG. 4 is a block diagram of a memory device to explain the effects of the exemplary embodiments.

Referring to FIG. 4, in order to use a geardown mode, a divider 205 and a flip-flop 209 are additionally necessary. Specifically, in order to obtain ½ of the frequency of the first clock CLK, the first clock CLK is provided to the ½ divider 205_2 through the clock buffer 201_2. The ½ divider 205_2 generates a second divided clock CLK_D22 that has ½ of the frequency of the first clock CLK. If the first mux 203_2 receives the first MRS signal MRS 2 in an enable state, the generated second divided clock CLK_D22 is provided from the first mux 203_2 to the second flip-flop 209_2. The second flip-flop 209_2 synchronizes the second divided clock CLK_D22 with the first signal C_S, and provides the synchronized signal SMP_CS to a final mux 210. Then, the final mux 210 selects a necessary signal and provides the selected signal to the command decoder 111.

If a plurality of geardown modes are necessary and a plurality of dividers are provided, a plurality of dividers 205, muxes 203, and flip-flops 209 are required in accordance with the number of geardown modes. For example, if five geardown modes are necessary, five dividers 205, five muxes 203, and five flip-flops 209 are also necessary. Further, since the first clock is delayed for a predetermined period of time as it passes through the divider 205 and the mux 203, it is necessary to delay the first signal C_S, which has passed through the signal buffer 201_1, through the signal delay 213_1 in order to synchronize the divided clock CLK_D2 with the first signal C_S in the flip-flop 209. Further, since the first signal C_S is delayed, it is necessary to delay the first clock CLK that is applied to the first flip-flop 209_1, and thus a clock delay 201_2 is also necessary.

Further, in order to select one synchronized signal SMP_CS that is provided to the command decoder 211, a final mux 210 that is connected to the n-numbered flip-flops 209 is additionally necessary.

As described above, if the dividers 205 are added to match the number of geardown modes in the case where the plurality of geardown modes are required, it is necessary to add the flip-flops 209 and the muxes 203 to match the number of dividers 205, and a final mux 210 for selecting the synchronized signal SMP_CS is necessary. As a result, as the number of geardown modes is increased, the required units or circuits are increased, and as the units or circuits are increased, timing skew is liable to occur.

However, like the memory device 100 according to an exemplary embodiment, if the first delay 105_1 and the (n−1) numbered dividers 105_2 to 105_*n* are connected to the n-numbered muxes 107 and the n-numbered muxes 107 are connected to one flip-flop 109, the size of the memory device can be reduced and the timing skew can be removed.

Figure 5:
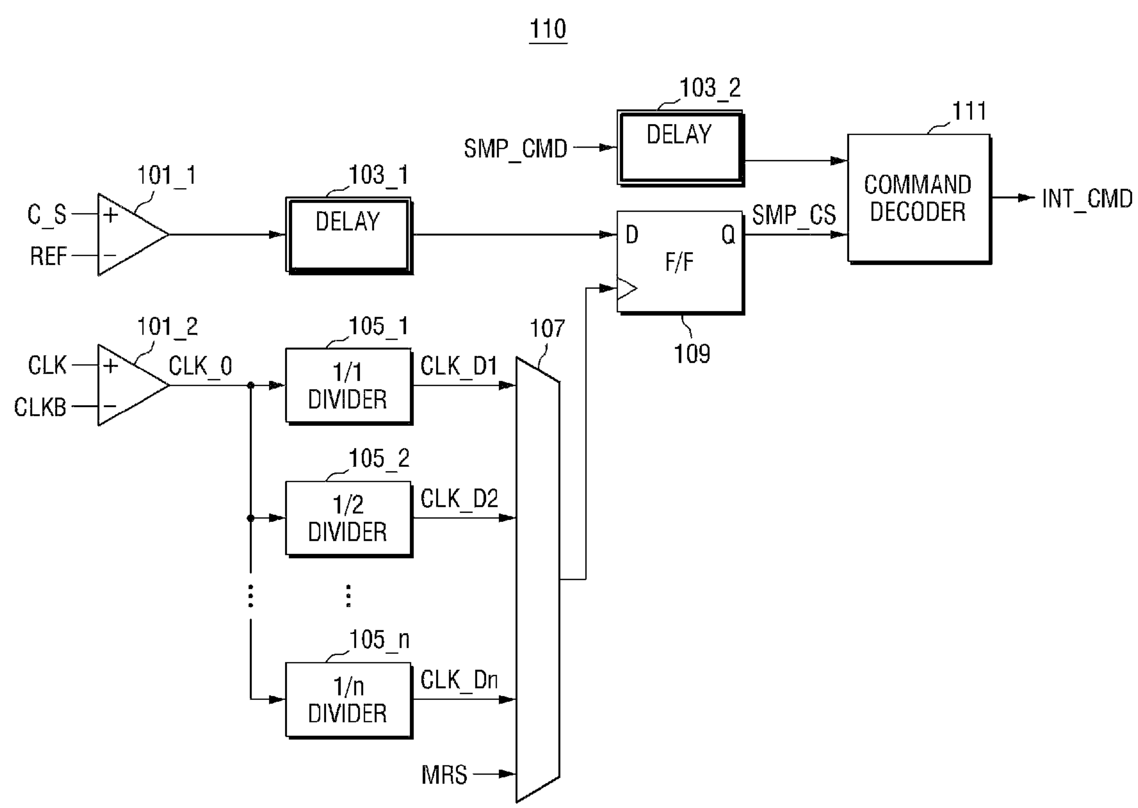
FIG. 5 is a block diagram of a memory device according to another exemplary embodiment.

Referring to FIG. 5, a memory device according to another exemplary embodiment will be described. Explanation of the contents duplicate to those as described above will be omitted, and an explanation will be made regarding different points between the memory devices according to one exemplary embodiment and another exemplary embodiment. FIG. 5 is a block diagram of a memory device according to another exemplary embodiment.

Referring to FIG. 5, unlike the memory device 100 according to an exemplary embodiment, a memory device 110 according to another exemplary embodiment only uses one mux 107. The first delay 105_1 and the (n−1) numbered dividers 105_2 to 105_*n* are all connected to the one mux 107, and the first to n-th divided clocks CLK_D1 to CLK_Dn, which are generated by the first delay 105_1 and the (n−1) numbered dividers 105_2 to 105_*n*, are provided to the mux 107. The mux 107 selects one of the first to n-th divided clocks CLK_D1 to CLK_Dn through the provided MRS signal MRS.

The mux 107 is connected to the one flip-flop 109, and provides the selected divided clock S_CLKD to the flip-flop 109.

The memory device 110 according to another exemplary embodiment uses the one mux 107, and thus can reduce the size of memory device 110.

Figure 6:
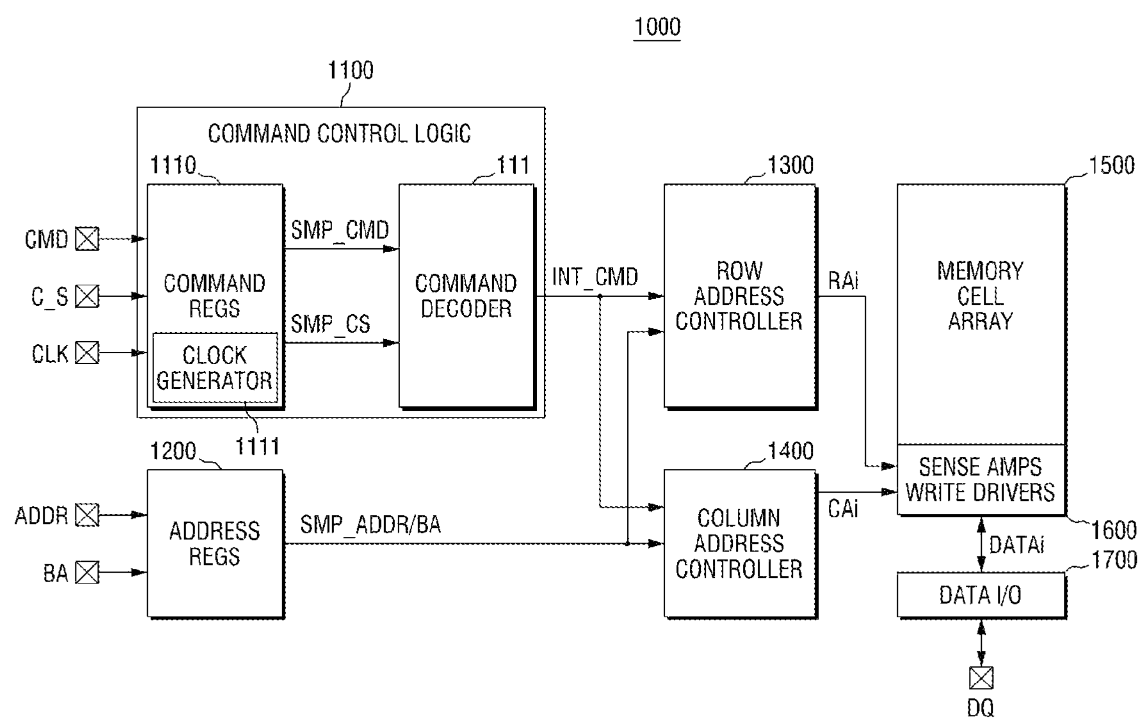
FIG. 6 is a block diagram explaining a memory device according to still another exemplary embodiment.

FIG. 6 is a block diagram explaining a memory device according to still another exemplary embodiment.

Referring to FIG. 6, a memory device 1000 includes a command control logic (COMMAND CONTROL LOGIC) 1100, an address register (ADDRESS REGS) 1200, a row address controller (ROW ADDRESS CONTROLLER) 1300, a column address controller (COLUMN ADDRESS CONTROLLER) 1400, a memory cell array (MEMORY CELL ARRAY) 1500, a sense amplifier/write driver (SENS AMPS/WRITE DRIVERS) 1600, and a data input/output (DATA I/O) 1700.

The command control logic 110 is configured to generate an internal command signal INT_CMD. The command control logic 110 may be configured to include a command register (COMMAND REGS) 1110 and a command decoder (COMMAND DECODER) 111. The command register 1110 may receive the command signal CMD, the first signal C_S, and the first clock CLK, and synchronize these signals with the selected divided clock S_CLKD. The command decoder 111 may receive the synchronized command signal SMP_CMD and the synchronized signal SMP_CS from the command register 1110, and generate the internal command signal INT_CMD using the above-described signals.

The command control logic 1100 may include a clock generator 1111. The clock generator 1111 may output the internal clock signal (CLK_D1 in FIG. 1) having a first cycle time in the first geardown mode, and output the internal clock signal (CLK_D2 in FIG. 1) having a second cycle time in the second geardown mode. The clock generator 1111 may be provided in substantially the same manner as the memory devices 100 and 110 except for the command decoder 111 in FIGS. 1 and 5.

The address register 1200 is configured to receive the address signal ADDR and a band address signal BA and to synchronize the above-described signals with the internal clock signal.

FIG. 6 illustrates that the clock generator 111 except for the command decoder 111 is included as a part constituent element of the command register 1110. However, the memory device 1111 may be configured separately from the command register 1110, and may be included as part of a constituent element of the command control logic 1100.

The row address controller 1300 is configured to receive an internal command signal INT_CMD and a synchronized address/bank address signal SMP_ADDR/BA, and to transmit a row address signal RAi to the memory cell array 1500.

The column address controller 1400 is configured to receive an internal command signal INT_CMD and a synchronized address/bank address signal SMP_ADDR/BA, and to transmit a column address signal CAi to the sense amplifier/write driver 1600.

The memory cell array 1500 is configured to include a plurality of memory cells that store data.

The sense amplifier/write driver 1600 is configured to read data which corresponds to the row address signal RAi and the column address signal CAi from the memory cell that is selected. The sense amplifier/write driver 1600 may write the data on the selected memory cell.

The data input/output 1700 is configured to transmit/receive a data signal DQ to/from an external system, to transmit an internal data signal DATAi for writing in the memory cell array 1500 to the sense amplifier/write driver 1600, or to receive the internal data signal DATAi that is read from the memory cell array 1500 from the sense amplifier/write driver 1600.

The first signal C_S is necessary to generate the internal command signal INT_CMD instructing the internal operation of the memory device 1000. Accordingly, the first signal C_S may include, for example, at least one of a CS (Chip Select) signal, a CE (Chip Enable) signal, a CKE (Clock Enable) signal, and an ODT (On-Die Termination) signal. However, the exemplary embodiments are not limited thereto.

If the first signal C_S is the CS signal and/or the CE signal, the memory device 1000 operates as follows. If the CS signal and/or the CE signal are applied, the memory device 1000 generates the internal command signal INT_CMD using the applied signals. The internal command signal INT_CMD is provided to the row address controller 1300 and the column address controller 1400, and the row address controller 1300 and the column address controller 1400 generate a row address signal RAi and a column address signal CAi using an address/bank address signal SMP_ADDR/BA that is synchronized with the internal command signal INT_CMD, and provides the generated address signals to the sense amplifier/write driver 1600. If the first signal C_S is the CS signal, the sense amplifier/write driver 1600 selects a memory cell, which corresponds to the row address signal RAi and the column address signal CAi, from among the plurality of memory cells, and if the first signal C_S is the CE signal, the sense amplifier/write driver 1600 enables the selected memory cell. After one memory cell of the memory cell array 1500 is selected and enabled, the data input/output 1700 may write data in the selected cell, or may read the data from the selected cell to output the read data.

If the first signal C_S is the CKE signal, the memory device 1000 operates as follows. If the CKE signal is applied, the memory device 1000 generates the internal command signal INT_CMD using the CKE signal. The internal command signal INT_CMD is provided to the row address controller 1300 and the column address controller 1400, and the row address controller 1300 and the column address controller 1400 provides the processed internal command signal INT_CMD as the RAi and CAi signals to the sense amplifier/write driver 1600. The sense amplifier/write driver 1600 receives the processed internal command signal INT_CMD as RAi and CAi, and enables the clock that is used to read or write the data. After enabling the clock, the data input/output 1700 may write the data in the memory cell array 1500, or may read the data from the selected cell to output the read data.

If the first signal C_S is the ODT signal, the memory device 1000 operates as follows. If the ODT signal is applied, the memory device 1000 generates the internal command signal INT_CMD using the ODT signal. The internal command signal INT_CMD is provided to the row address controller 1300 and the column address controller 1400, and the row address controller 1300 and the column address controller 1400 provides the processed internal command signal INT_CMD as Rai and CAi signals to the sense amplifier/write driver 1600. The sense amplifier/write driver 1600 receives the processed internal command signal INT_CMD as RAi and CAi signals, and activates the ODT circuit which is an impedance matching circuit. After activating the ODT circuit, the data input/output 1700 may write the data in the memory cell array 1500, or may read the data from the selected cell to output the read data. Through the ODT circuit, high-speed data input/output can be performed.

On the other hand, although it is described that the ODT circuit is included in the sense amplifier/write driver 1600, the position of the ODT circuit is not limited thereto. For example, the ODT circuit may be included in the data input/output 1700.

Although the case where the first signal C_S is the CS signal, the CE signal, the CKE signal, or the ODT signal is exemplarily described, the exemplary embodiments are not limited thereto. It will be fully analogized by those skilled in the art that how the memory device 1000 operates in the case where the first signal C_S is a signal for instructing the internal operation of another memory device 1000.

Figure 7:
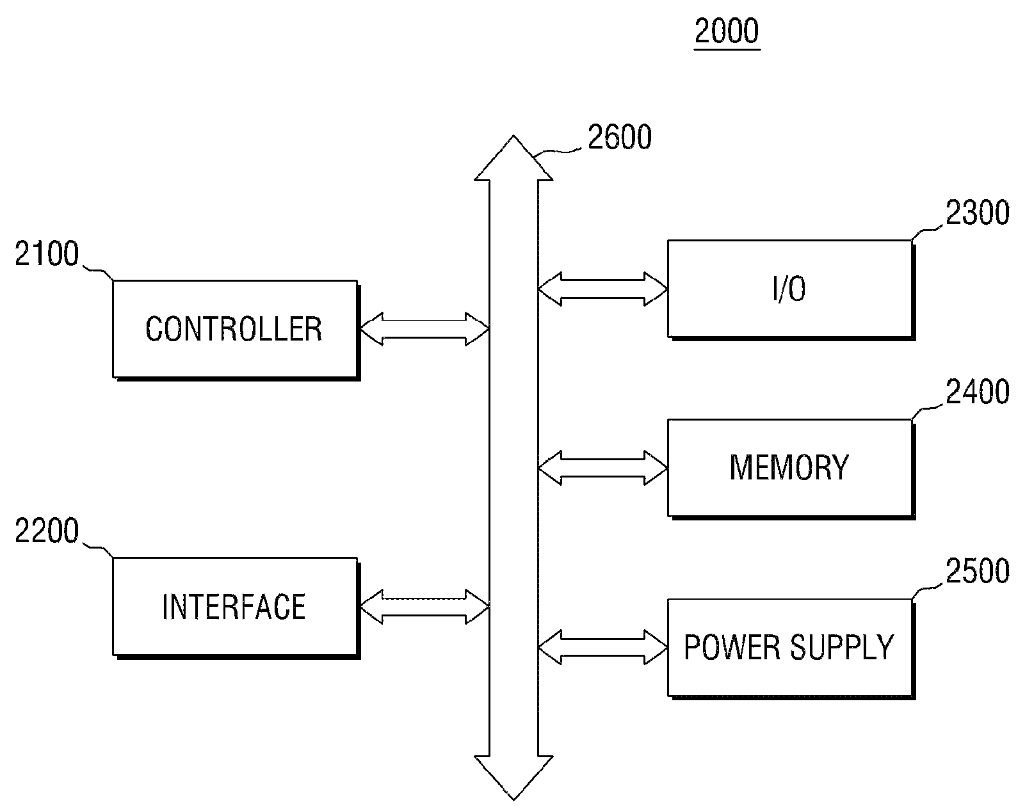
FIG. 7 is a block diagram explaining an electronic system that includes the memory device according to some exemplary embodiments.

FIG. 7 is a block diagram explaining an electronic system that includes the memory device according to some exemplary embodiments.

Referring to FIG. 7, an electronic system 2000 may include a controller 2100, an interface 2200, an input/output (I/O) 2300, a memory 2400, a power supply 2500, and a bus 2600.

The controller 2100, the interface 2200, the I/O device 2300, the memory 2400, and the power supply 2500 may be coupled to one another through the bus 2600. The bus 2600 corresponds to paths through which data is transferred.

The controller 2100 may include at least one of a microprocessor, a microcontroller, and logic elements that can perform similar functions, and process data.

The interface 2200 may function to transfer the data to a communication network or receive the data from the communication network. The interface 2200 may be in a wired or wireless form. In an exemplary embodiment, the interface 2200 may include an antenna or a wire/wireless transceiver.

The I/O device 2300 may include a keypad and a display device to input/output data.

The memory 2400 may store data and/or commands. The memory devices 100, 110, and 1000 as described above with reference to FIGS. 1, 5, and 6 may be provided as part of constituent elements of the memory 2400.

The power supply 2500 may convert the power input from an outside source and provide the power to the respective constituent elements 2100 to 2400.

In addition, the memory devices 100, 110, and 1000 according to some exemplary embodiments may be provided as one of various constituent elements of electronic devices, such as a computer, a UMPC (Ultra Mobile PC), a work station, a net-book, a PDA (Personal Digital Assistants), a portable computer, a web tablet, a wireless phone, a mobile phone, a smart phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, a digital video player, a device that can transmit and receive information in a wireless environment, one of various electronic devices constituting a home network, one of various electronic devices constituting a computer network, one of various electronic devices constituting a telematics network, an RFID device, or one of various constituent elements constituting a computing system.

Figure 8:
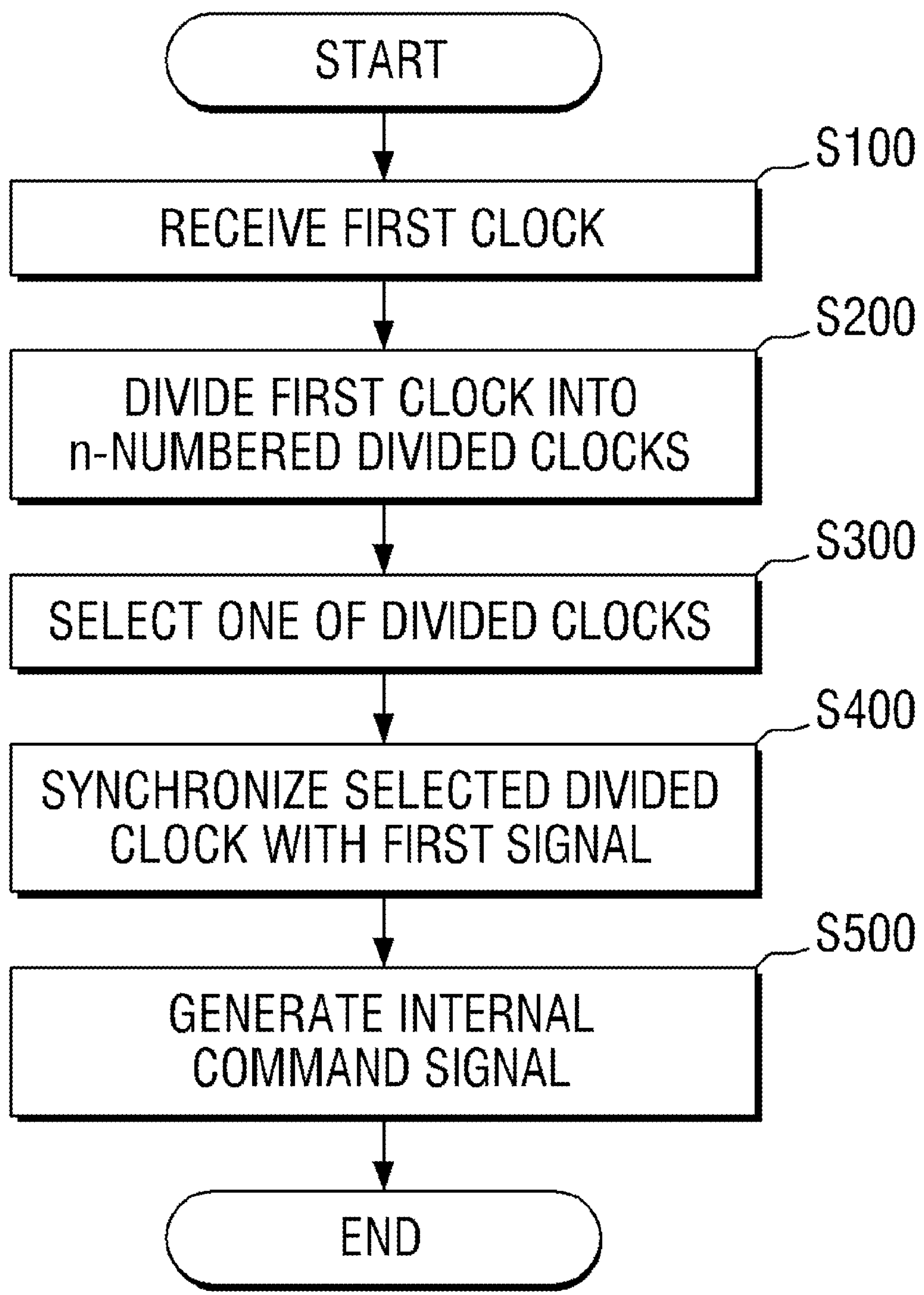
FIGS. 8 and 9 are flowcharts explaining a method for driving a memory device according to an exemplary embodiment.
Figure 9:
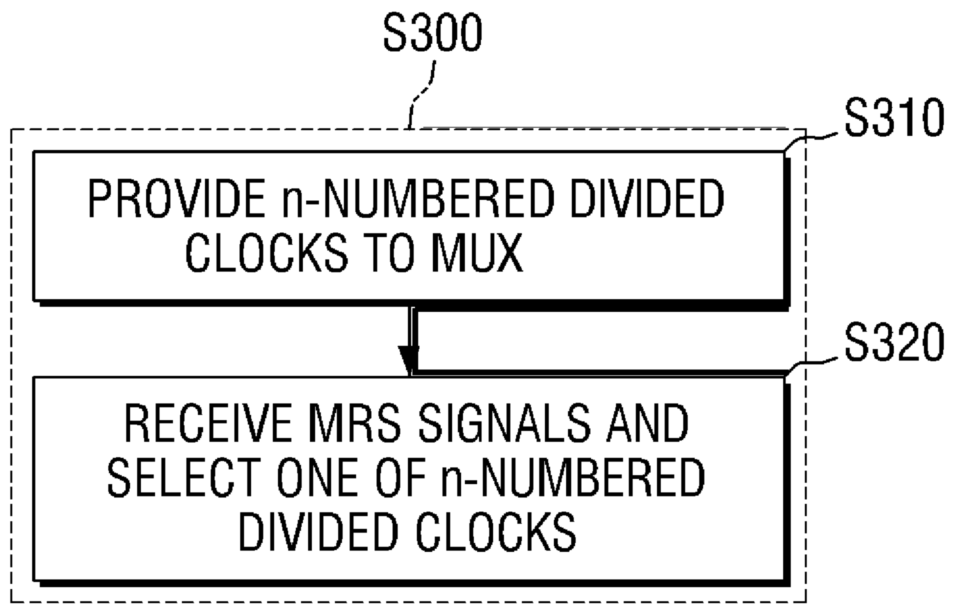

Referring to FIGS. 8 and 9, a method of driving a memory device according to an exemplary embodiment will be described. FIGS. 8 and 9 are flowcharts which explain a method of driving a memory device according to an exemplary embodiment.

referring to FIG. 8, the memory device receives the first clock (S100). Then, the first clock is provided to the n-numbered dividers, and the n-numbered dividers generate n-numbered divided clocks through division of the first clock (S200). Here, n is a positive integer. The 1/1 divider from among the n-numbered dividers may be the first delay 105_1 of FIG. 1. The divided clocks refer to the clocks that are obtained by changing the period of the first clock. The first divided clock may have the same frequency as the first clock, the second divided clock may have ½ of the frequency of the first clock, and the n-th divided clock may have 1/n of the frequency of the first clock. The n-numbered dividers respectively generate first to n-th divided clocks.

The n-numbered divided clocks may have duties below ½, and the duties of the first to n-th divided clocks may be successively decreased. Further, the first to n-th divided clocks may have the same high level time. Since the duties have been described in detail, further explanation thereof will be omitted.

Then, one of the n-numbered divided clocks is selected (S300). The MRS signal is received, and using this, one of the n-numbered divided clocks can be selected using the MRS signal. Specifically, referring to FIG. 9, the n-numbered divided clocks are provided to the mux 107 (S310). Then, the MRS signal is provided to the mux 107. The mux 107 selects and outputs one of the n-numbered divided clocks according to the provided MRS signal (S320). The selected divided clock that is output as described above is provided to the flip-flop 109 that is connected to the mux 107 through one path.

Then, referring again to FIG. 8, the selected divided clock and the first signal are synchronized with each other (S400).

The synchronization may be performed in the flip-flop 109.

Then, the internal command signal is generated using the synchronized signal (S500). The command decoder 111, which has received the synchronized signal, may generate the internal command INT_CMD.

Figure 10:
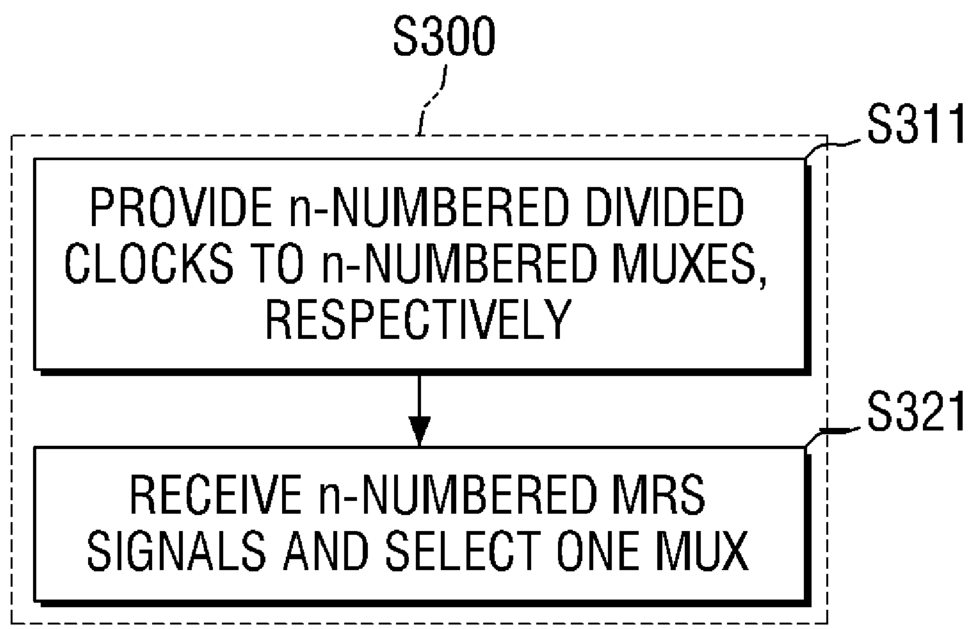
FIG. 10 is a flowchart explaining a method for driving a memory device according to another exemplary embodiment.

Referring to FIG. 10, a method for driving a memory device according to another exemplary embodiment will be described. Explanation of the contents duplicate to those as described above will be omitted, and explanation will be made with respect to the different points between the methods according to one and other exemplary embodiments.

FIG. 10 is a flowchart which explains a method of driving a memory device according to another exemplary embodiment.

The method of driving a memory device according to another exemplary embodiment is different from the method for driving a memory device according to an exemplary embodiment with respect to selecting one of the divided clocks. Specifically, referring to FIG. 10, the n-numbered dividers correspond to the n-numbered muxes in a one-to-one manner. Accordingly, the first to n-th divided clocks, which are generated from the n-numbered dividers are respectively provided to the n-numbered muxes 107 (S311). The memory device receives the n-numbered MRS signals, and the n-numbered muxes 107 respectively receive the MRS signals in a one-to-one manner. Only the n-numbered muxes 107, which are enabled through the MRS signals, output the divided clocks to the flip-flop 109. That is, one of the n-numbered muxes 107 is selected through the reception of the n-numbered MRS signals, and thus one of the n-numbered divided clocks is selected (S321).

The steps of the method or algorithm, which have been described in relation to the exemplary embodiments, may be directly implemented by hardware executed by a processor, a software module, or a combination of the two. The software module may reside in a RAM memory, a flash memory, a ROM memory, an EPROM memory, an EEPROM memory, a register, a hard disk, a detachable disk, a CD-ROM, or a recording medium that can be read by a computer of a certain different type that is well known in the art.

The exemplary recording medium may be coupled to the processor, and the processor may read information from the recording medium or write information on the recording medium. In another method, the recording medium may be integral with the processor. The processor and the storage medium may reside in an application specific integrated circuit (ASIC). The ASIC may reside in a user terminal.

In another method, the processor and the storage medium may reside in a user terminal as an individual component.

Although exemplary embodiments have been described for illustrative purposes, those skilled in the art will appreciate that various modifications, additions and substitutions are possible, without departing from the scope and spirit of the inventive concept as disclosed in the accompanying claims.

What is claimed is:

1. A memory device comprising:

(n−1) numbered dividers configured to divide a first clock and generating second to n-th divided clocks where, n is a positive integer that is equal to or larger than 2 (n≥2);

a first delay configured to generate a first divided clock that is obtained by delaying the divided first clock for the same period of time as the second to n-th divided clocks are delayed;

a mux configured to receive the first to n-th divided clocks and selecting one of the first to n-th divided clocks;

a flip-flop connected to the mux and configured to receive and synchronize the selected first to n-th divided clock and a first signal with each other; and a command decoder configured to decode the synchronized signal provided from the flip-flop and generate an internal command signal.

2. The memory device of claim 1, wherein the mux is configured to receive a Mode Register Set signal.

3. The memory device of claim 1, wherein the mux comprises n-numbered muxes which are connected to the first delay and the (n−1) numbered dividers in a one-to-one manner.

4. The memory device of claim 3, wherein the n-numbered muxes are configured to receive n-numbered MRS signals.

5. The memory device of claim 1, further comprising a second delay configured to delay the first signal for a time period as long as the selected first to n-th divided clock is delayed.

6. The memory device of claim 1, further comprising a third delay configured to delay a command that is additionally provided to the decoder for as long a time period as the synchronized signal.

7. The memory device of claim 1, wherein the duty of the second to n-th divided clocks are smaller than ½.

8. The memory device of claim 7, wherein the duty of the first to n-th divided clocks is successively decreased.

9. The memory device of claim 8, wherein clock levels of the first to n-th divided clocks include a first level and a second level, and times when the clock level is the first level in one period of the first to n-th divided clocks are equal to each other.

10. The memory device of claim 9, wherein times when the clock level is the second level in the one period of the first to n-th divided clocks is different from each other.

11. A memory device comprising:

a command control logic configured to generate an internal command signal;

a memory cell array including a plurality of memory cells; and a sense amplifier/write driver configured to receive the internal command signal and operating the memory cell array, wherein the command control logic is configured to include:

(n−1)-numbered dividers configured to divide a first clock and generating second to n-th divided clocks where, n is a positive integer that is equal to or larger than 2 (n≥2);

a first delay configured to generate a first divided clock that is obtained by delaying the first clock for the same period of time as the second to n-th divided clocks are delayed;

a mux configured to receive the first to n-th divided clocks and selecting one of the first to n-th divided clocks;

a flip-flop connected to the mux and configured to receive and synchronize the selected one of the first to n-th divided clocks and a first signal with each other; and a command decoder configured to decode the synchronized signal provided from the flip-flop and generating an internal command signal.

12. The memory device of claim 11, wherein the first signal includes a Chip Select signal, and the sense amplifier/write driver is configured to select one of the plurality of memory cells using the internal command signal that is generated by the first signal.

13. The memory device of claim 12, wherein the first signal includes a Chip Enable signal, and the sense amplifier/write driver is configured to enable the selected memory cell using the internal command signal that is generated by the first signal.

14. The memory device of claim 11, wherein the sense amplifier/write driver comprises an On-Die Termination circuit, the first signal being configured to include an ODT signal, and the sense amplifier/write driver enables the ODT circuit using the internal command signal that is generated by the first signal.

15. The memory device of claim 11, wherein the duty of the first to n-th divided clocks is successively decreased.

16. The memory device of claim 1, wherein the first signal includes at least one of a Chip Select signal, a Chip Enable signal, a Clock Enable signal, an On-Die Termination signal, an address signal, and an external command signal.

17. A memory device comprising:

a first delay configured to generate a first divided clock;

(n−1) numbered dividers configured to generate second to n-th divided clocks;

a mux configured to receive the first to n-th divided clocks and select one of the first to n-th divided clocks;

a flip-flop connected to the mux and configured to receive and synchronize with each other a first signal and the selected first to n-th divided clock; and a command decoder configured to decode the received and synchronized signal provided from the flip-flop and generate an internal command signal.

18. The memory device of claim 17, wherein the (n−1) numbered dividers divide the first clock prior to the first divided clock being generated by the first delay.

19. The memory device of claim 17, wherein n of the n−1 numbered dividers is a positive integer that is equal to or larger than 2 (n≥2).

20. The memory device of claim 17, wherein the generated first divided clock is obtained by delaying the first clock for the same period of time as the second to n-th divided clocks are delayed.

* * * * *